United States Patent
Gaffney et al.

[19]

[11] Patent Number: 6,068,235
[45] Date of Patent: May 30, 2000

[54] MICROPHONE CONNECTOR ASSEMBLY AND METHOD

[75] Inventors: David G. Gaffney, Evanston, Ill.; Robert F. Young, Santa Cruz, Calif.

[73] Assignee: 3Com Corporation, Rolling Meadows, Ill.

[21] Appl. No.: 09/032,333

[22] Filed: Feb. 26, 1998

[51] Int. Cl.[7] ........................................................ H01R 3/00
[52] U.S. Cl. ............................ 248/694; 381/361; 439/500
[58] Field of Search .................................... 248/560, 689, 248/514, 538, 74.1, 231.61, 316.6, 694; 381/368, 361, 355, 356; 439/500, 356, 929, 626, 856

[56] References Cited

U.S. PATENT DOCUMENTS

| | | | |
|---|---|---|---|
| 5,042,071 | 8/1991 | Stinauer et al. | 381/368 |
| 5,701,355 | 12/1997 | Brannan et al. | 381/355 |
| 5,740,263 | 4/1998 | Liao | 381/361 |
| 5,823,820 | 10/1998 | Patel et al. | 381/361 |
| 5,830,007 | 11/1998 | Fry et al. | 439/500 |

*Primary Examiner*—Anita M. King
*Attorney, Agent, or Firm*—Baniak Nicholas Pine & Gannon

[57] ABSTRACT

A microphone connector assembly includes a housing enclosing a resilient damping grommet. The grommet includes an opening for receiving and orienting a microphone fitted in the grommet opening so that the face of the microphone forms a plane substantially perpendicular to the top side of the circuit board on which it is placed. The connector may alternatively include an inner portion connected to an outer portion by at least one narrow web portion. The inner portion includes an opening for receiving the microphone.

24 Claims, 4 Drawing Sheets

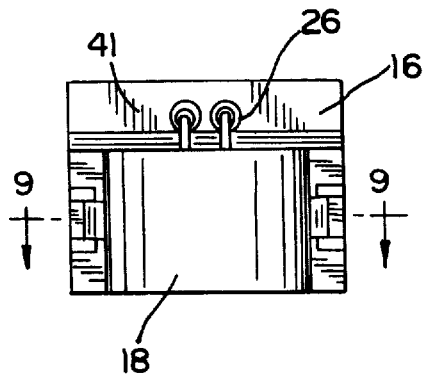
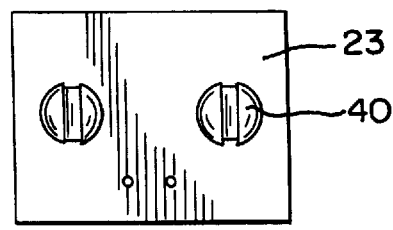
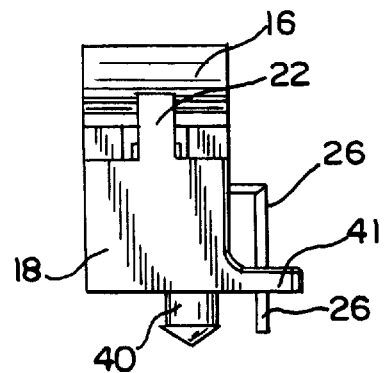
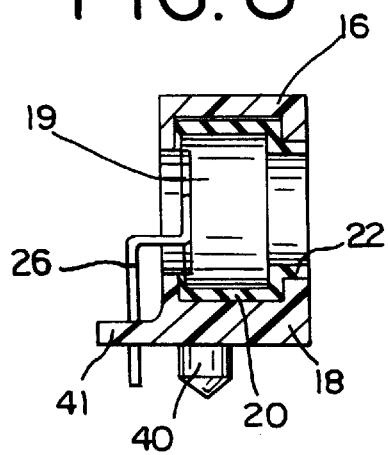
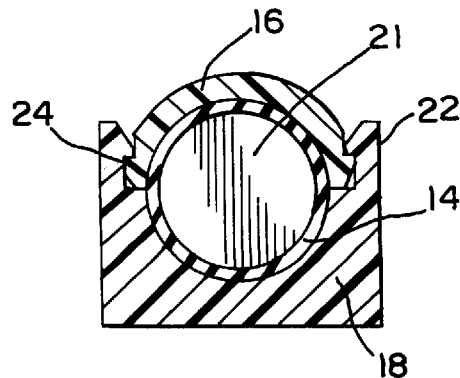

MICROPHONE CONNECTOR ASSEMBLY AND METHOD

FIELD OF THE INVENTION

The invention relates generally to the field of electrical connectors and, in particular, to a microphone connector for use on standard circuit boards.

BACKGROUND OF THE INVENTION

Microphones used in electronic devices such as speaker phones are typically surface mounted on circuit boards, and are oriented with the face of the microphone facing up. Typically, these microphones are unidirectional. The microphone is then wave soldered to the circuit board along with the other components.

The problem with mounting the microphone in this manner is that the microphone is susceptible to vibrations from speakers or other sources. The face-up orientation of the microphone also reduces the range of sound pick up. It would be desirable to have a microphone connector that would improve the range of sound pick up and reduce vibration to the microphone.

SUMMARY OF THE INVENTION

One aspect of the invention provides for a microphone connector assembly comprising a housing including an opening formed therein, and a grommet positioned in the housing opening. The grommet includes an opening formed therein for receiving and orienting a microphone fitted in the grommet opening so that the face of the microphone forms a plane that is substantially perpendicular to a bottom side of the housing. Preferably, the grommet may be made from a resilient, high damping material. The housing may preferably be made of a rigid, plastic material.

Another aspect of the invention provides for a method of connecting a microphone on a circuit board comprising inserting a microphone in a resilient high damping grommet, enclosing the grommet in a rigid housing to form a housing assembly, and placing the housing on a circuit board in a position where a face of the microphone forms a plane which is substantially perpendicular to a top side of the circuit board. Lead wires which extend from a back portion of the microphone and through the circuit board may be wave soldered to the circuit board.

Another aspect of the invention provides for a microphone connector comprising an outer portion including a bottom side having at least one board lock extending therefrom for positioning on a circuit board, an inner portion having an opening formed therein for receiving a microphone and securing it so the face of the microphone forms a plane substantially perpendicular to a top side of the circuit board, and at least one thin web portion connecting the inner portion to the outer portion. The outer portion may surround the inner portion. Preferably, the connector is made of a resilient damping material.

Another aspect of the invention provides for a method of connecting a microphone on a circuit board comprising inserting a microphone in an opening formed in an inner portion of a connector where the inner portion is connected to the outer portion by at least one thin web portion, and placing the connector on a circuit board in a position where a face of the microphone forms a plane which is substantially perpendicular to a top side of the circuit board. The microphone may be retained within the inner portion by at least one tab formed near the periphery of the inner portion opening.

The foregoing and other features and advantages of the invention will become further apparent from the following detailed description of the presently preferred embodiments, read in conjunction with the accompanying drawings. The detailed description and drawings are merely illustrative of the invention rather than limiting, the scope of the invention being defined by the appended claims and equivalents thereof.

BRIEF DESCRIPTION OF THE DRAWINGS

FIG. 5 is a top view of the embodiment of FIG. 1;

FIG. 6 is a bottom view of the embodiment of FIG. 1;

FIG. 7 is a side view of the embodiment of FIG. 1;

FIG. 8 is a section view of the microphone connector assembly taken through lines 8—8 FIG. 3;

FIG. 9 is a sectional view of the microphone connector assembly taken through lines 9—9 of FIG. 5;

DETAILED DESCRIPTION OF THE PRESENTLY PREFERRED EMBODIMENTS

Figure 1:
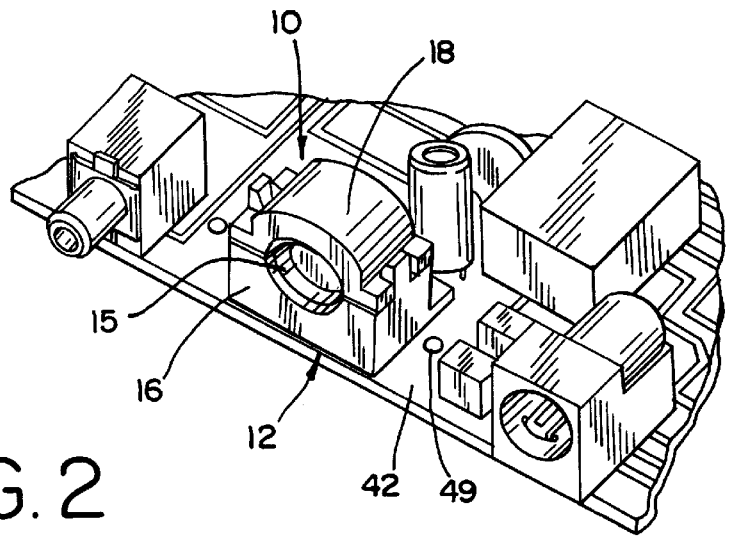
FIG. 1 is a perspective view of a preferred embodiment of the microphone connector assembly mounted on a PC board.

Referring to FIGS. 1–9, a preferred embodiment of a microphone connector assembly 10 includes a housing 12 and grommet 14 which fits within an opening 15 in the housing. The grommet 14 includes an opening 17 formed therein for receiving and orienting a microphone 19 fitted in the grommet opening 17 so that a face 21 of the microphone forms a plane substantially perpendicular to a bottom side 23 of housing 12 or circuit board 42 on which the microphone connector assembly is positioned. This allows the microphone 19 to be positioned upright with the face 21 perpendicular to the top side of the circuit board 42, rather than being surface mounted. This upright microphone orientation increases the sound pick-up range, and reduces feedback.

In the embodiment shown in FIGS. 1–9, the housing 12 may preferably include a bottom housing member 16 and a top housing member 18, which are shaped to form opening 15 when connected. The bottom housing member 16 may include tabs 22 which fit through and attach to flanges 24 formed on the top housing member 18. The top and bottom housing members 18, 16 may accordingly be easily snapped together, and then may be sonically welded together.

Figure 2:
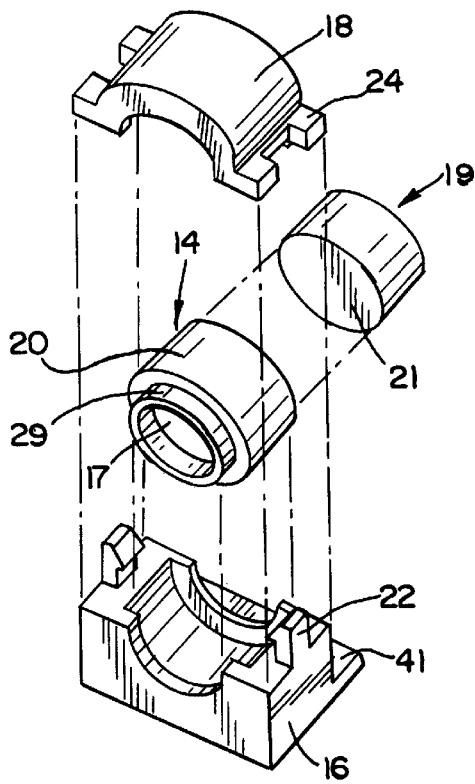
FIG. 2 is an exploded perspective view of the microphone connector assembly of FIG. 1.
Figure 3:
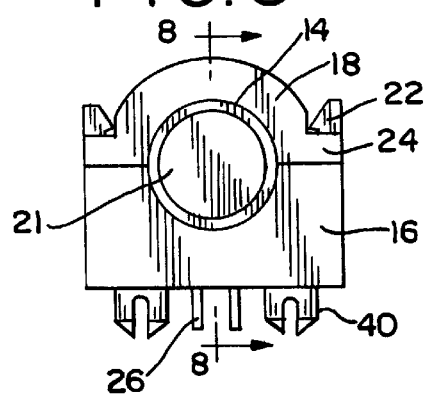
FIG. 3 is a front view of the embodiment of FIG. 1.
Figure 4:
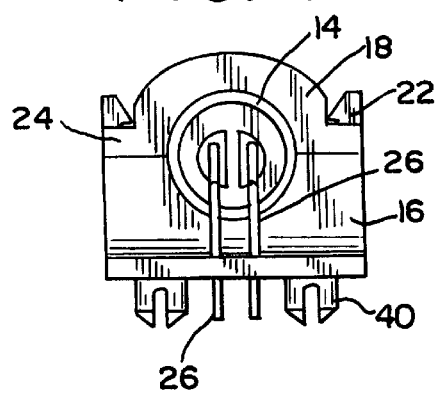
FIG. 4 is a back view of the embodiment of FIG. 1.
Figure 10:
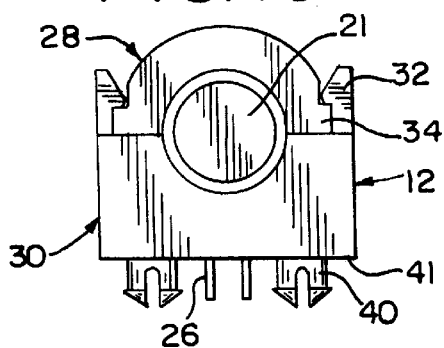
FIG. 10 is a front view of an alternative embodiment for use with an uni-directional microphone.
Figure 11:
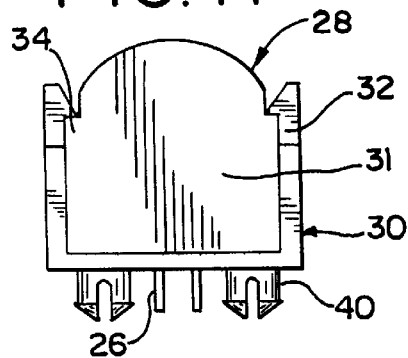
FIG. 11 is a back view of the embodiment of FIG. 10.
Figure 12:
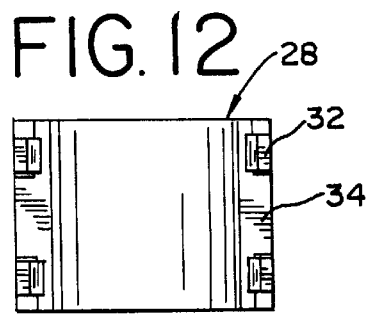
FIG. 12 is a top view of the embodiment of FIG. 10.
Figure 13:
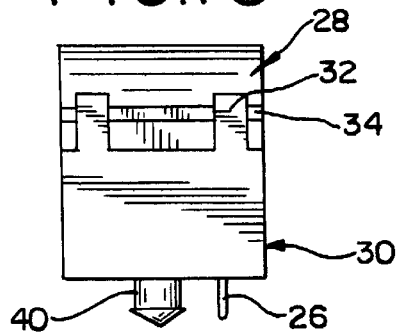
FIG. 13 is a side view of the embodiment of FIG. 10.
Figure 14:
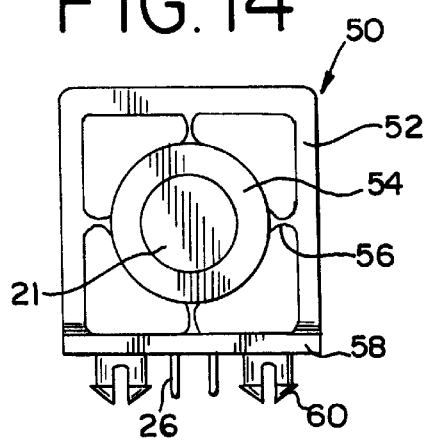
FIG. 14 is a front view of an alternative preferred embodiment of the microphone connector assembly.
Figure 15:
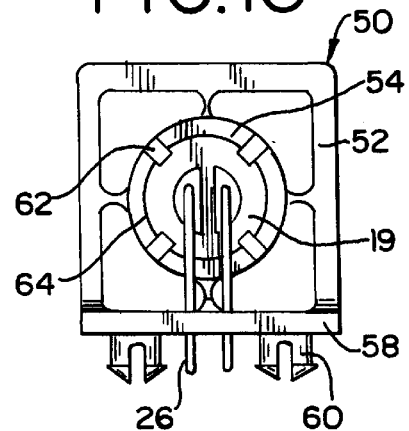
FIG. 15 is a back view of the embodiment of FIG. 14.
Figure 16:
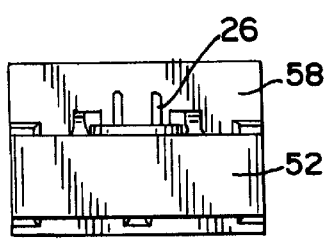
FIG. 16 is a top view of the embodiment of FIG. 14.
Figure 17:
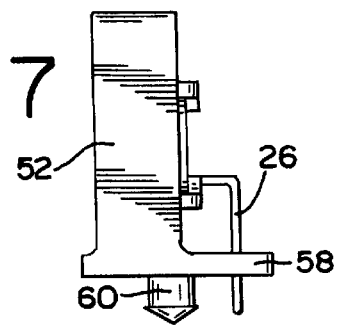
FIG. 17 is a side view of the embodiment of FIG. 14.
Figure 18:
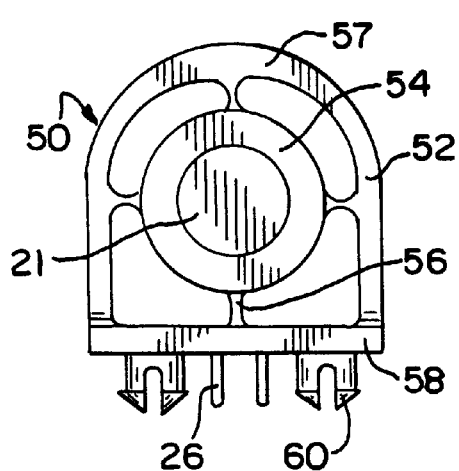
FIG. 18 is a front view of an alternative embodiment of a microphone connector assembly.
Figure 19:
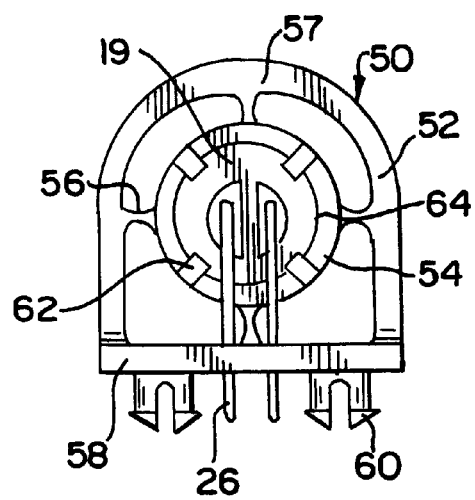
FIG. 19 is a back view of the embodiment of FIG. 18.
Figure 20:
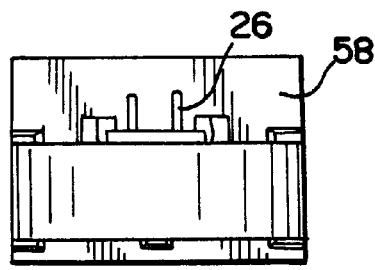
FIG. 20 is a top view of the embodiment of FIG. 18.
Figure 21:
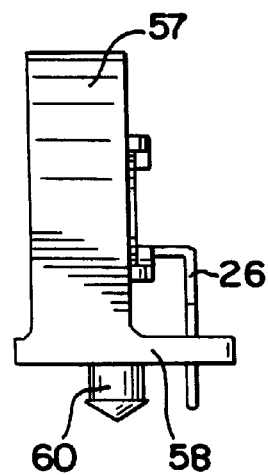
FIG. 21 is a side view of the embodiment of FIG. 18.

Referring to FIG. 2, the grommet 14 may include, for example, a first portion 20 having a greater diameter then second portion 29. The first and second portions 20 and 29 may preferably be received in top and bottom housing members 18 and 16, which are contoured to match the shape of the grommet 14. This grommet configuration aids in retaining the microphone 19 after it is inserted in the grommet opening 17. As shown in FIG. 4, the back of the microphone connector may be open. Alternatively, the back of the microphone connector may be closed, as shown in FIG. 11. The alternative embodiment shown in FIGS. 10–13 may preferably be used in systems using an omni-directional microphone. The open back configuration shown in FIG. 4, may preferably be used with unidirectional microphones. Lead wires 26 may preferably attach to the back of the microphone 19 and extend through a base portion 41 of the bottom housing member 16 and through the circuit board 42. The lead wires 26 may then be wave soldered to the circuit board 42.

Referring to the alternative embodiment shown in FIGS. 10–13, the housing 12 includes a top housing member 28 and a bottom housing member 30, which are designed to provide a closed back side 31. A plurality of tabs 32 are designed to engage with flange 34. The housing members 28, 30 may then be sonically welded together. At least one board lock 40 may preferably extend from a base portion 47 of the bottom housing member 30. Each of the board locks 40 are designed to engage with an opening 49 formed in the circuit board 42. The housing 12 of the embodiments of FIGS. 1–13 is preferably made of a rigid material such as, for example, ABS plastic, to allow the microphone connector assembly to be easily placed on a circuit board 42 by a pick and place machine.

Alternatively, the rigid housing 12, and grommet 14 may be replaced by a microphone connector 50 made of a resilient damping material such as, for example, Santaprene, which is available from Monsanto Corp. As shown in FIGS. 14–17, the microphone connector 50 includes outer portion 52, which is connected to inner portion 54 by at least one web portion 56. The outer portion 52 may, for example, have a substantially square shape. Alternatively, outer portion 52 may have a rounded top portion 57, as shown in the embodiment of FIGS. 18–21. Various other shapes for the inner and outer portions are contemplated. The thin web portions 56 reduce vibrations to the microphone 19 by limiting the path to the inner portion 56 from the outer portion 52. Preferably, the web portions 56 are made as thin as structurally possible to support the inner portion 56 and microphone 19 within the outer portion 52. In the embodiment shown, the web portions 56 may, for example, have a thickness of approximately about 0.02–0.03 inches.

At a base 58 of the outer portion 52, at least one board lock 60 is formed to engage with an opening formed in the circuit board 42. Retaining tabs 62 are preferably formed around the periphery of the inner portion opening 64 to retain the microphone 19 within the inner portion 54.

While the embodiments of the invention disclosed herein are presently considered to be preferred, various changes and modifications can be made without departing from the spirit and scope of the invention. The scope of the invention is indicated in the appended claims, and all changes that come within the meaning and range of equivalents are intended to be embraced therein.

We claim:

1. A microphone connector assembly comprising:
    a housing including an opening formed therein, the housing fixedly mounted to a circuit board, a grommet positioned in the housing opening, the grommet including an opening formed therein, a microphone fitted within the grommet opening, the microphone encircled by the grommet, a face of the microphone forming a plane that is substantially perpendicular to a top side of the circuit board.

2. The assembly of claim 1, wherein the housing comprises a top housing member and a bottom housing member.

3. The assembly of claim 1, further comprising a unidirectional microphone.

4. The assembly of claim 1, wherein the grommet is made of a resilient, high damping material.

5. The assembly of claim 4, wherein the grommet comprises santaprene.

6. The assembly of claim 1, wherein the housing comprises a rigid plastic material.

7. The assembly of claim 1, wherein the housing opening is formed through a front portion of the housing and does not pass through to a back portion of the housing.

8. The assembly of claim 7, further comprising an omnidirectional microphone.

9. The assembly of claim 1, wherein the grommet includes a first portion having a first diameter, and a second portion having a second diameter that is smaller than the first diameter, the housing is contoured to receive both first and second portions of the grommet in the housing opening.

10. A method of connecting a microphone on a circuit board comprising the steps of:
    inserting the microphone in a grommet;
    encircling the microphone with the grommet;
    enclosing the grommet in a rigid housing to form a housing assembly;
    mounting the housing assembly to the circuit board; and
    positioning a face of the microphone so that the face of the microphone forms a plane which is substantially perpendicular to a top side of the circuit board.

11. The method of claim 10, further comprising the steps of inserting at least one board lock formed in a bottom portion of the housing into an opening formed in the circuit board.

12. The method of claim 10, further comprising the steps of wave soldering lead wires which extend from a back portion of the microphone and extend through the circuit board.

13. A microphone connector comprising:
    an outer portion including a bottom side having at least one board lock extending therefrom for positioning on a circuit board;
    an inner portion having an opening formed therein, a microphone received in the opening, a face of the microphone forming a plane substantially perpendicular to a top side of the circuit board; and
    at least one web portion connecting the inner portion to the outer portion.

14. The connector of claim 13, wherein the outer portion surrounds the inner portion.

15. The connector of claim 14, wherein the outer portion has a substantially square shape, and the inner portion has a substantially circular shape.

16. The connector of claim 14, wherein the outer portion has a curved top portion.

17. The connector of claim 13, wherein there are a plurality of web portions connecting the outer portion to the inner portion.

18. The connector of claim 13, wherein the connector comprises a resilient damping material.

19. The connector of claim 18, wherein the connector comprises santaprene.

20. A method of connecting a microphone on a circuit board comprising the steps of:

inserting the microphone in an opening formed in an inner portion of a connector, the inner portion connected to an outer portion of the connector by at least one web portion;

placing the connector on the circuit board; and positioning a face of the microphone so that the face of the microphone forms a plane which is substantially perpendicular to a top side of the circuit board.

21. The method of claim 20, further comprising the steps of inserting at least one board lock formed in a bottom portion of the outer portion of the connector into an opening formed in the circuit board.

22. The method of claim 20, further comprising the steps of wave soldering lead wires which extend from a back portion of the microphone and extend through the circuit board.

23. The method of claim 20, further comprising the steps of retaining the microphone within the inner portion of the connector with at least one tab formed near the periphery of the inner portion opening.

24. A method of connecting a microphone on a circuit board comprising the steps of:

inserting the microphone in an opening formed in an inner portion of a connector, the inner portion connected to an outer portion of the connector by at least one web portion;

placing the connector on the circuit board in a position where a face of the microphone forms a plane which is substantially perpendicular to a top side of the circuit board; and extending wave soldering lead wires from a back portion of the microphone to the circuit board.

\* \* \* \* \*